(12) United States Patent
Kim

(10) Patent No.: US 8,076,840 B2
(45) Date of Patent: Dec. 13, 2011

(54) ORGANIC ELECTRO-LUMINESCENCE DISPLAY AND MANUFACTURING METHOD THEREOF

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 267 days.

(21) Appl. No.: 12/362,228

(22) Filed: Jan. 29, 2009

(65) Prior Publication Data

US 2009/0200932 A1    Aug. 13, 2009

Related U.S. Application Data (63) Continuation of application No. 10/824,364, filed on Apr. 15, 2004, now Pat. No. 7,538,484.

(30) Foreign Application Priority Data

Apr. 16, 2003    (KR) .................. 10-2003-0024103

(51) Int. Cl.
H05B 33/04    (2006.01)

(52) U.S. Cl. ........................ 313/504; 313/512

(58) Field of Classification Search .......... 313/498–512; 315/169.3; 345/36, 45, 76
See application file for complete search history.

(56) References Cited

U.S. PATENT DOCUMENTS

| | | | |
|---|---|---|---|
| 5,962,970 A | 10/1999 | Yokoi et al. | |
| 6,383,664 B2 | 5/2002 | Bernius et al. | |
| 6,656,611 B2 | 12/2003 | Tai et al. | |
| 6,717,357 B2 | 4/2004 | Okuyama et al. | |
| 2001/0030320 A1* | 10/2001 | Budd et al. | 257/40 |
| 2001/0054867 A1* | 12/2001 | Kubota | 313/504 |
| 2003/0080678 A1* | 5/2003 | Kim et al. | 313/504 |
| 2004/0036411 A1 | 2/2004 | Kim et al. | |
| 2004/0140759 A1 | 7/2004 | Park et al. | |
| 2007/0247065 A1 | 10/2007 | Ko et al. | |

FOREIGN PATENT DOCUMENTS

| | | |
|---|---|---|
| DE | 101 33 684 A1 | 2/2003 |
| EP | 0 996 314 A1 | 4/2000 |
| GB | 2 348 050 A | 9/2000 |
| JP | S59-166224 | 11/1984 |
| JP | 2000195675 | 7/2000 |
| JP | 2000243555 | 9/2000 |
| JP | 2000243577 | 9/2000 |
| JP | 2001176657 | 6/2001 |
| JP | 2001-230073 A | 8/2001 |
| JP | 2002008871 | 1/2002 |
| JP | CN 1329455 A | 1/2002 |
| JP | 2004214154 | 7/2004 |
| KR | 10-2001-0083584 A | 9/2001 |

OTHER PUBLICATIONS

Japanese Office Action dated Nov. 25, 2009.
Chinese Office Action dated Mar. 28, 2008.
European Search Report dated Mar. 14, 2006.

* cited by examiner

*Primary Examiner* — Nimeshkumar Patel
*Assistant Examiner* — Christopher Raabe
(74) *Attorney, Agent, or Firm* — Ked & Associates LLP (57) ABSTRACT

Disclosed is an organic EL display panel and a manufacturing the same, the EL display panel including an organic EL display panel including a bulkhead for insulating an emitting cell from an anode strip, the emitting cell having an ITO strip, a supplement electrode, an organic EL layer, and the anode strip, and at least one supplement bulkhead for coupling the bulkheads for preventing the sealant is injected along the bulkhead to the emitting cell thereby an inferior device is reduced and yield is increased.

24 Claims, 11 Drawing Sheets

FIG. 7F

ORGANIC ELECTRO-LUMINESCENCE DISPLAY AND MANUFACTURING METHOD THEREOF

CROSS-REFERENCE TO RELATED APPLICATIONS

This application is a Continuation Application of prior U.S. patent application Ser. No. 10/824,364 filed Apr. 15, 2004, now U.S. Pat. No. 7,538,484 which claims priority under 35 U.S.C. §119 to Korean Application No. P2003-24103, filed on Apr. 16, 2003, whose entire disclosures are hereby incorporated by reference.

BACKGROUND

1. Field

The present invention relates to a display panel, and more particularly, to an organic electro-luminescence display and a manufacturing method thereof.

2. Background

In recent years, a variety of a magnetic type luminescence display has been developed, and a basic structure of the magnetic type luminescence display is a horizontal array of light emitting devices driving one pixel as an element. As an example of the magnetic type luminescence display, there are a VFE (Vacuum Fluorescence Display), an EL (Electro-luminescence), an LED (Light Emitting Diode), and a FED (Field Emission Display) as well as a PDP (Plasma Display Panel) having a cell as a luminescence device, the cell divided by a discharge area.

Among the magnetic type luminescence displays, particularly, an organic EL display panel enabling to obtain a surface luminescence with high brightness at a low voltage and RGB luminescence with a high degree of purity has come to be the center of attention for a ultra slim size, a light weight, and full color.

The organic EL display forms an organic layer including an emitting layer between a couple of electrodes including an anode applied to a positive voltage and a cathode applied to a negative voltage. In the organic display, by applying voltage between electrodes, an electron from cathode and a hole from anode are injected into each organic layer, and the electrode and the hole are coupled in the organic layer thereby light is emitted. The EL display panel including the organic EL device is described in reference to appended drawings.

Figure 1:
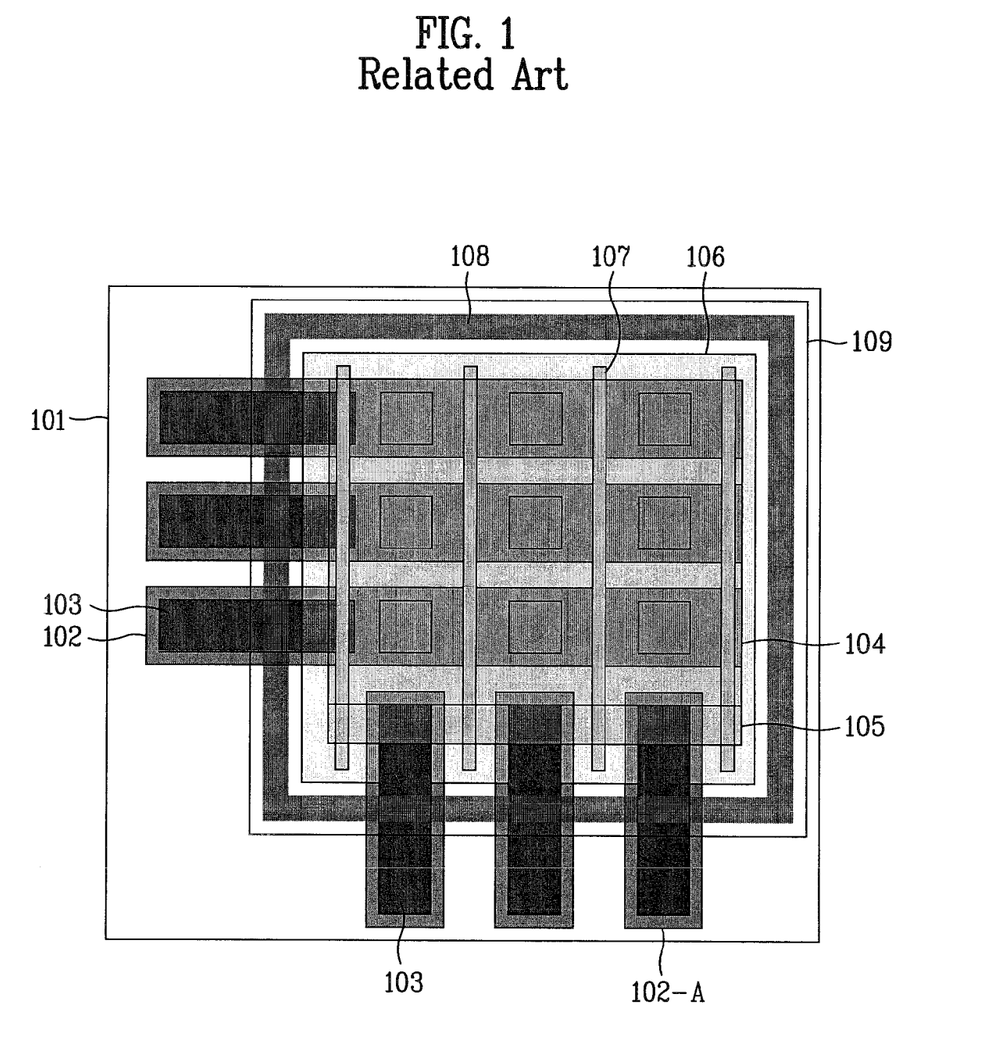
FIG. 1 illustrates a floor plan of a conventional organic display panel.

FIG. 1 illustrates a floor plan of a conventional organic display panel. As illustrated in the drawing, the organic display panel includes a glass substrate 101, an ITO strip 102 formed in a strip form and arrayed in a line on the glass substrate, a supplement electrode 103 formed in a smaller width than the ITO strip on the ITO strip 102, an organic EL layer 104 having a hole transport layer, the emitting layer, and an electron transport layer piled on the ITO strip 102, an insulating film 106 formed between the ITO strip 102 and a bulkhead, an anode strip 105 crossing the ITO strip 102 on the organic EL layer 104 and formed in a band, a bulkhead 107 formed in the band form between the anode strips 105 for separating the neighboring anode strips 105, and a seal-cover 109 coupled to a substrate having the anode strip 105 by using a sealant 108.

In this case, the organic EL display panel is formed in a structure wherein the organic EL layer 104 is inserted between the ITO strip 102 having one higher work function and the anode strip 105 having one lower work function on the glass substrate 101. The ITO strip 102 having one higher work function is employed as an anode for injecting the hole and the anode strip 105 having one lower work function is employed as a cathode for injecting the electron.

FIG. 2A to FIG. 2F illustrates a perspective view showing an organic EL display panel in accordance with the related art. First, as illustrated in FIG. 2, a transparent ITO strip 102 is formed on the glass substrate 101 for applying the anode. In this case, an ITO strip 102-A having a short length is also formed between the bulkheads 107 for extracting the anode strip 105 with ease.

Figure 2A:
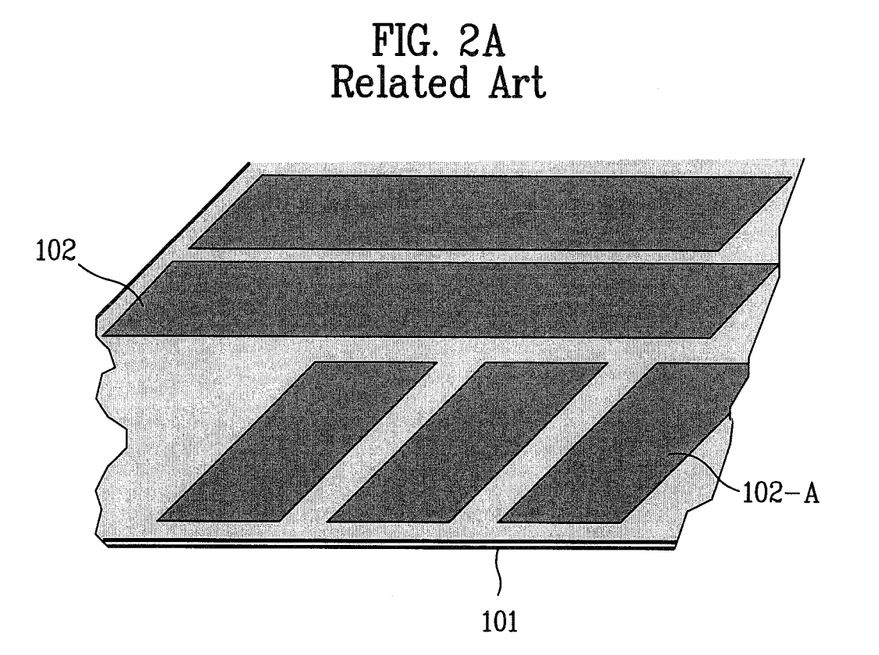
FIG. 2A to FIG. 2F illustrates a perspective view showing an organic EL display panel in accordance with a related art.
Figure 2B:
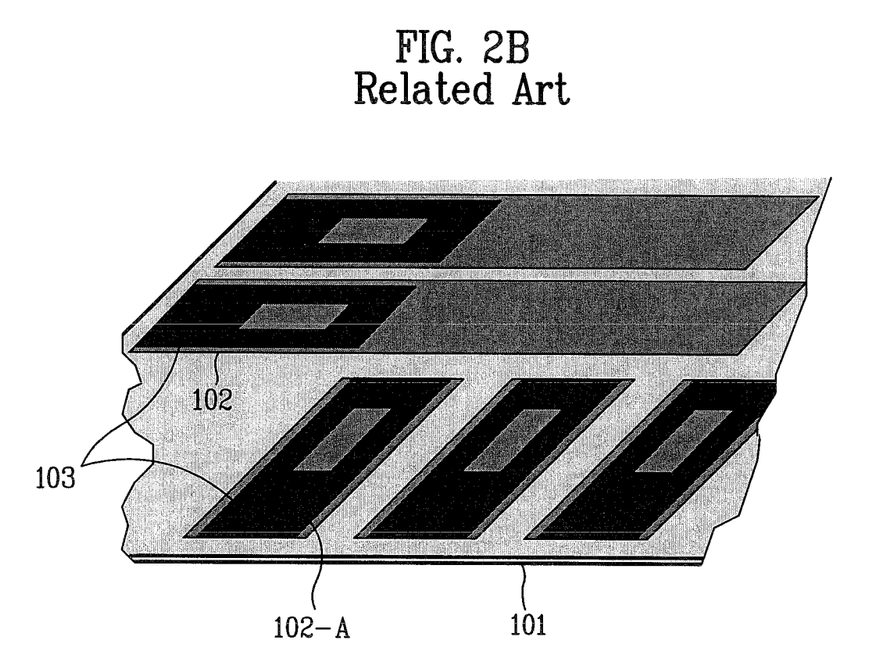

And then, as illustrated in FIG. 2B, the supplement electrode 103 is formed of such conductive metal as Mo and Cr. In this instance, if a width of the supplement electrode 103 is wider than the ITO strip 102 at a location where the sealant 108 and the supplement electrode 103 are crossed, the sealant 108 on the supplement electrode 103 is not hardened □□ when the sealant 108 is hardened by using UV. Therefore, the width of the supplement electrode 103 at the location where the sealant 108 and the supplement electrode 103 are crossed is set narrower than the ITO strip 102 thereunder.

Figure 2C:
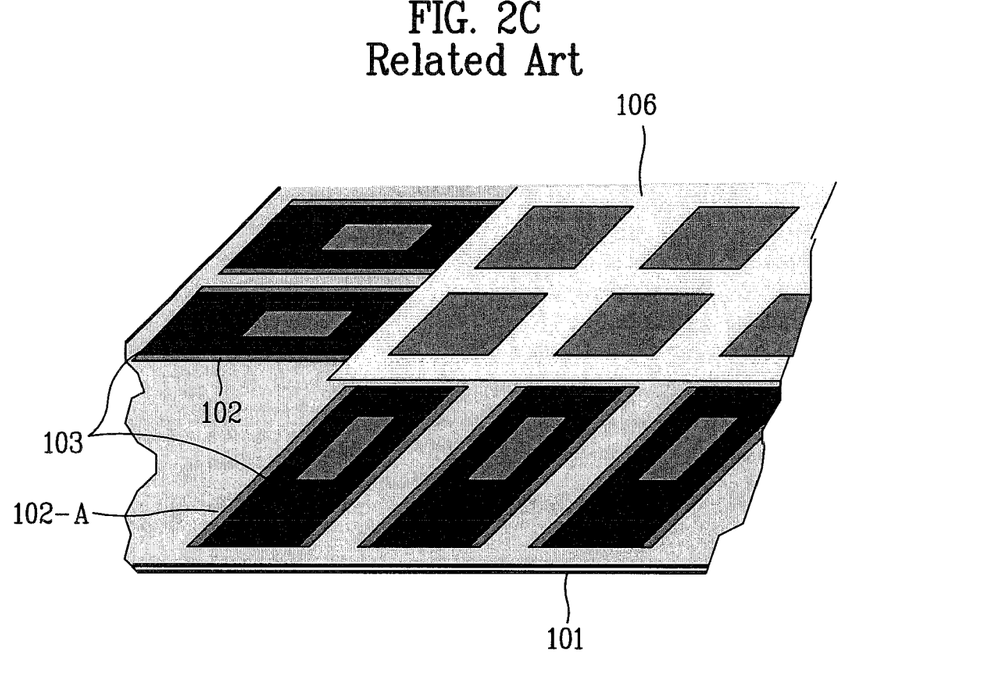
Figure 2D:
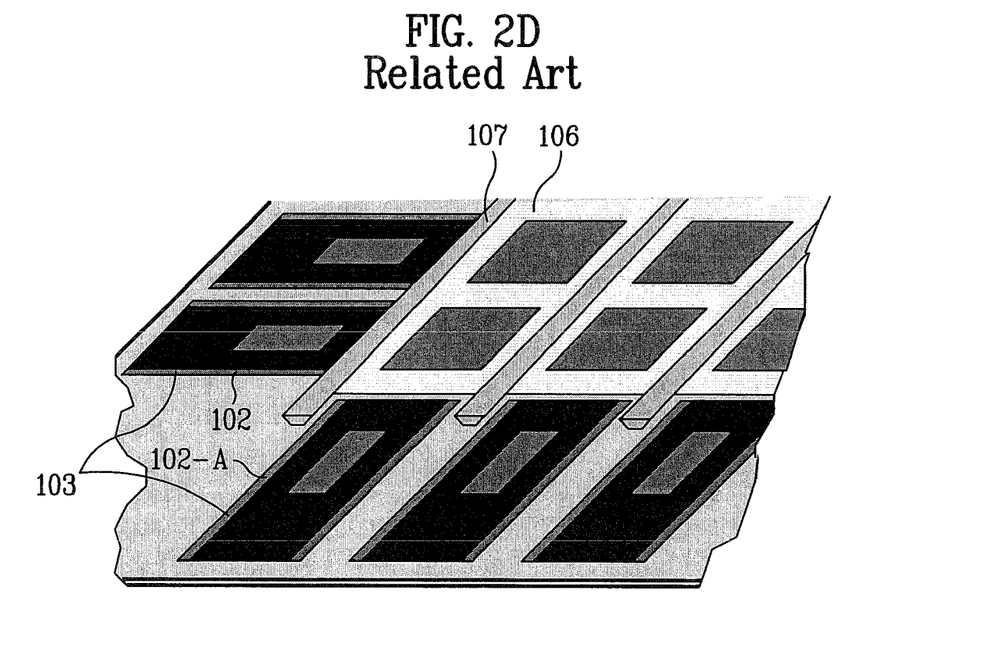

Subsequently, as illustrated in FIG. 2C and FIG. 2D, the ITO strip 102 further includes the insulating film 106 for insulating the bulkhead 107 from the anode strip 105. In this case, the insulating film 106 is formed in a blended form of an organic matter, an inorganic matter, and a macromolecule.

Figure 2E:
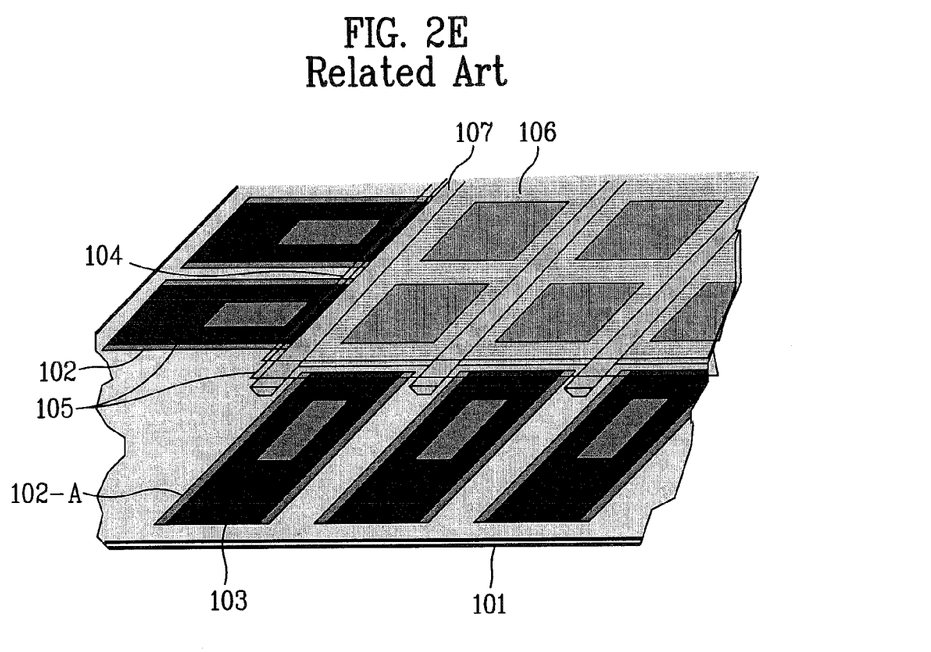
Figure 2F:
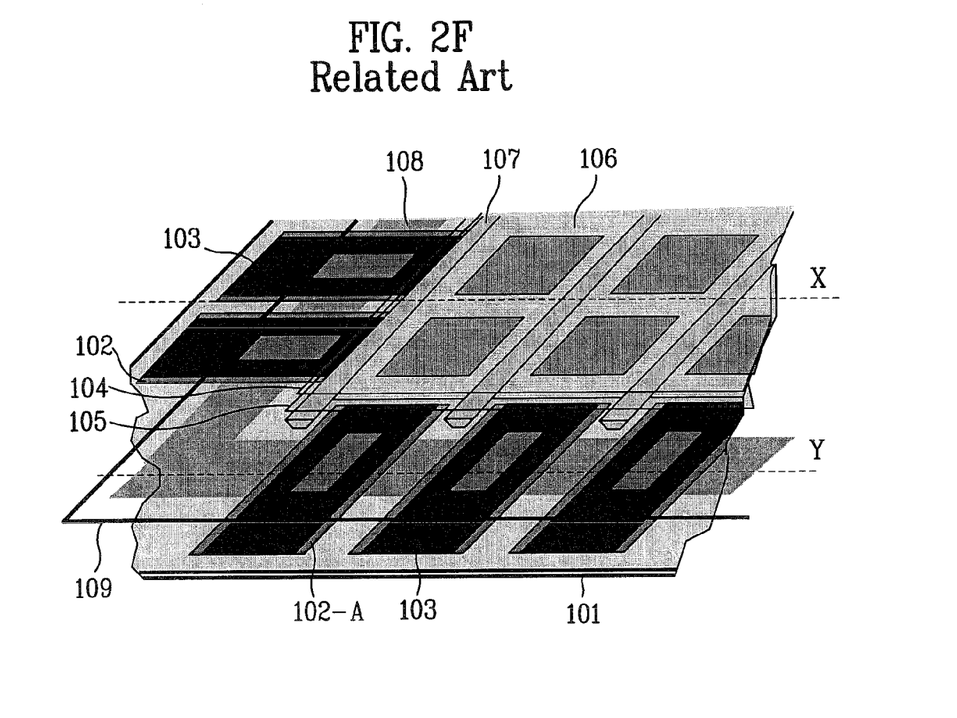

As illustrated in FIG. 2E and FIG. 2F, an organic layer 104 is formed on top of the insulating film 106 and the bulkhead 107, and then the anode strip 105 including Mg—Ag compound metal and aluminum or other conductive matter is formed. Finally, the seal-cover 109 is adhered by using the sealant 108.

Figure 3:
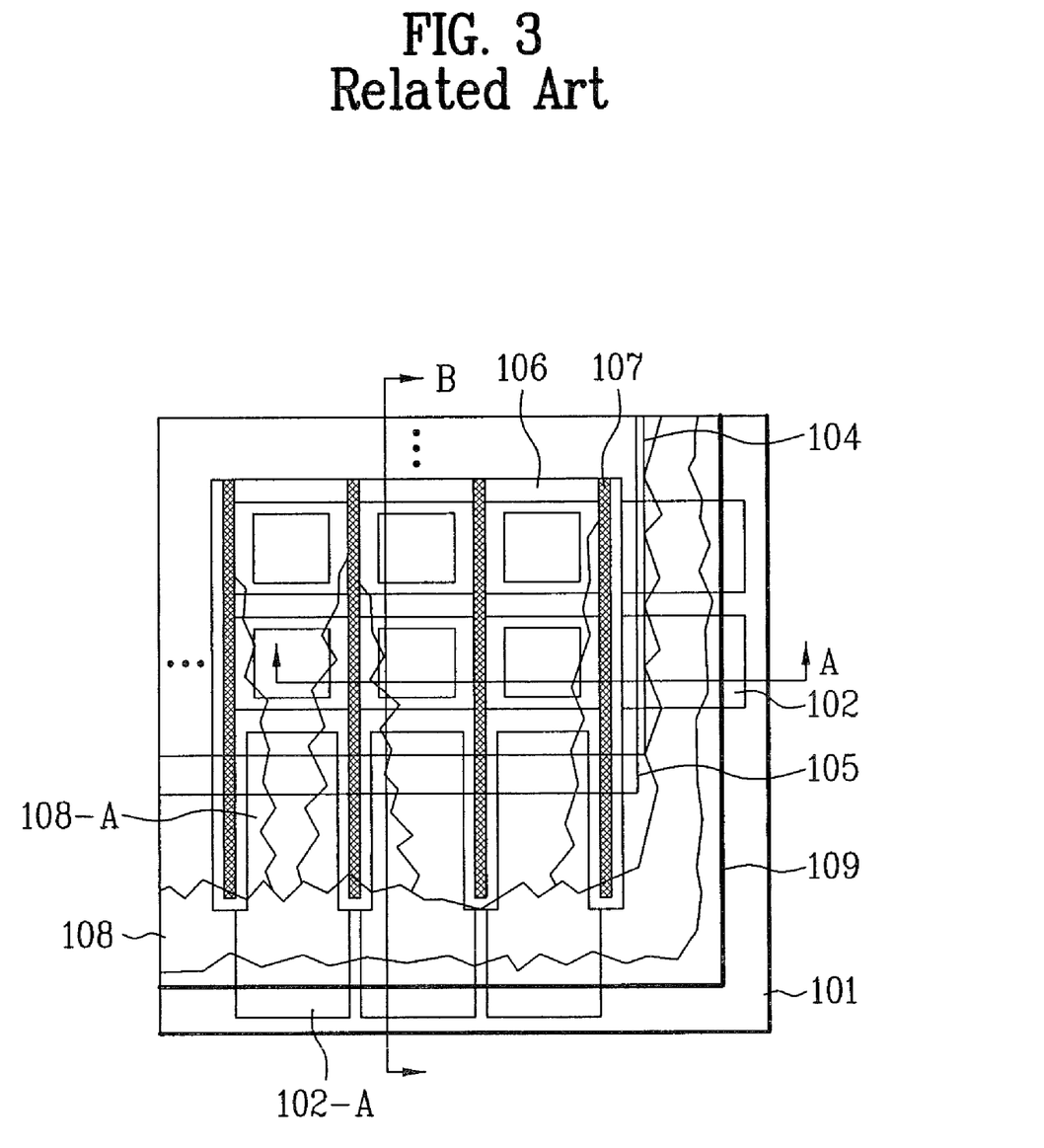
FIG. 3 illustrates a floor plan showing an organic EL display panel after a glass substrate and a seal-cover are adhered by using a sealant in accordance with a related art.

FIG. 3 illustrates a floor plan showing an organic EL display panel after the glass substrate and the seal-cover are adhered by using the sealant in accordance with the related art.

As illustrated in FIG. 3, when the glass substrate 101 and the seal-cover 109 are adhered by using the sealant 108, there is a problem that the sealant 108 is injected along the bulkhead 107 into an emitting cell. The problem is described referring to FIG. 4A and FIG. 4B.

Figure 4A:
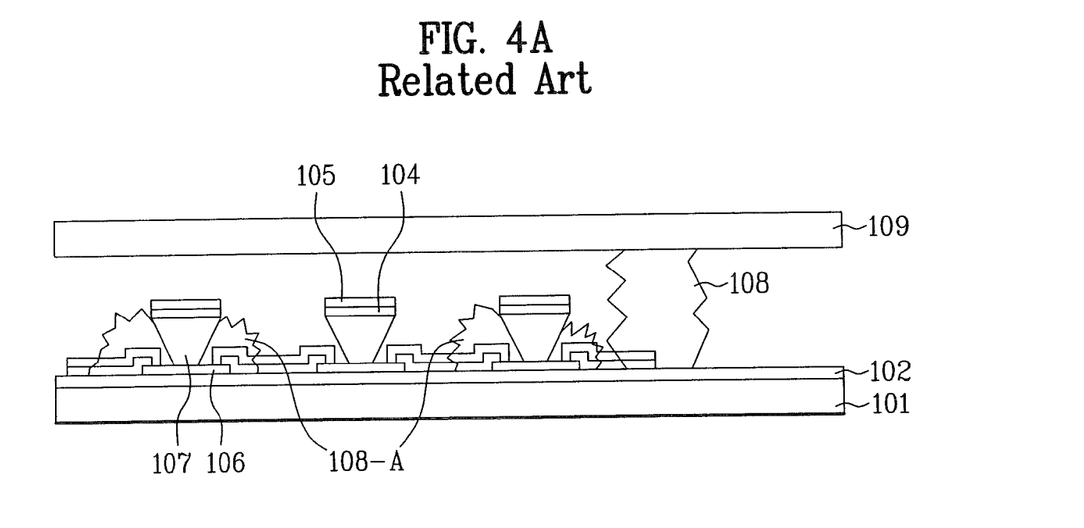
FIG. 4A illustrates a cross-sectional view of a display panel illustrated in FIG.
Figure 4B:
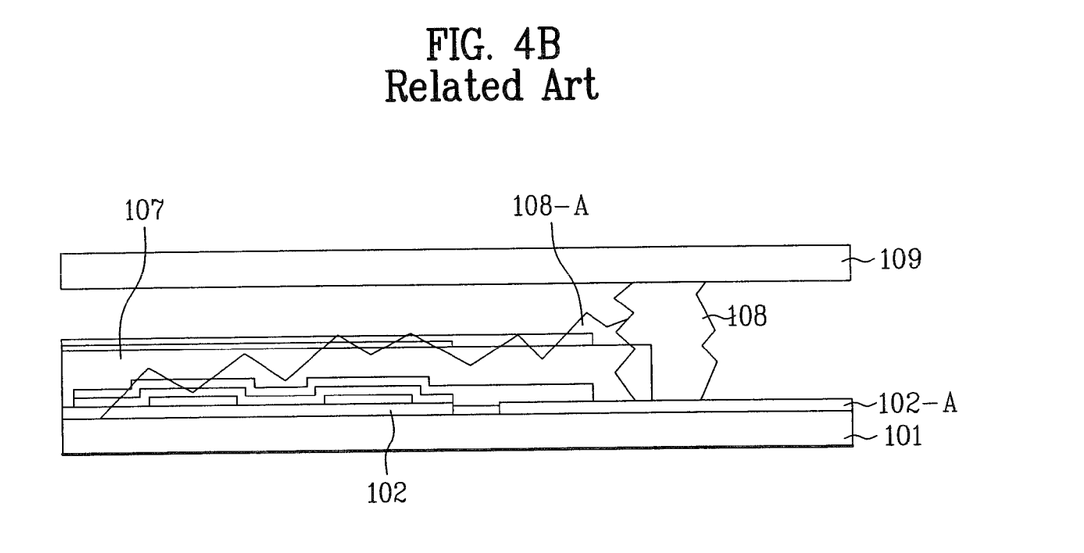
FIG. 4B illustrates a cross-sectional view of a panel illustrated in FIG. 3 in accordance with a B direction.

FIG. 4A illustrates a cross-sectional view of the display panel illustrated in FIG. 3 in accordance with an A direction, and FIG. 4B illustrates a cross-sectional view of the panel illustrated in FIG. 3 in accordance with a B direction.

As illustrated in the drawings, when the sealant 108 is in contact with the bulkhead 107, the sealant 108 is injected along the bulkhead 107 into the emitting cell. Then, the sealant 108-A influences the anode strip and the organic matter, thereby resulting a problem of an inferior emitting cell.

SUMMARY OF THE INVENTION

Accordingly, the present invention is directed to an organic EL (Electro-luminescence) display panel that substantially obviates one or more problems due to limitations and disadvantages of the related art.

An object of the present invention is to provide an organic EL display panel and a manufacturing method of the same for preventing a sealant from being injected along a bulkhead into an emitting cell when a glass substrate and a seal-cover is adhered by using a sealant.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the organic EL display panel including an emitting cell having an ITO strip, a supplement electrode, an organic EL layer, and an anode strip, and a bulkhead for insulating the emitting cell from the anode strip, being characterized in, the organic EL display panel further including at least one supplement bulkhead for coupling the bulkheads.

Desirably, the supplement bulkhead is provided in an area between the emitting cell and the sealant. Desirably, the supplement bulkhead forms a predetermined angle with the bulkhead.

In another aspect of the present invention, a method of manufacturing an organic EL display panel includes the steps of forming a supplement electrode in a smaller width than ITO strip, forming an insulating film, forming a bulkhead and at least one supplement bulkhead coupling the bulkheads, forming an organic EL layer and an anode strip, and adhering the seal-cover and the glass substrate by using a sealant.

Desirably, in the fourth step of the process, the bulkhead and the supplement bulkhead are formed at the same time.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings;

FIGS. 4A and 4B each illustrate a cross-sectional view of Y direction of an organic display panel in accordance with the related art.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 5A:
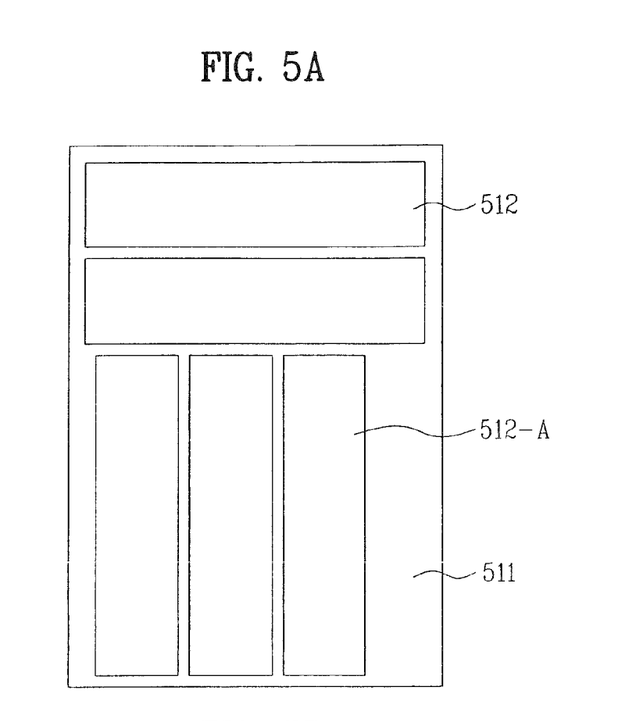
FIG. 5A to FIG. 5G illustrate a manufacturing process of an organic EL display panel in accordance with the present invention.

FIG. 5A to FIG. 5G illustrate a manufacturing process of an organic EL display panel in accordance with the present invention. First, as illustrated in FIG. 5A, an ITO strip 512 is formed on a glass substrate 511 for applying an anode. In this case, an ITO strip 512-A having a short length is formed between bulkheads to be described later at the same time to make it easier to extract an anode strip to be described later.

Figure 5B:
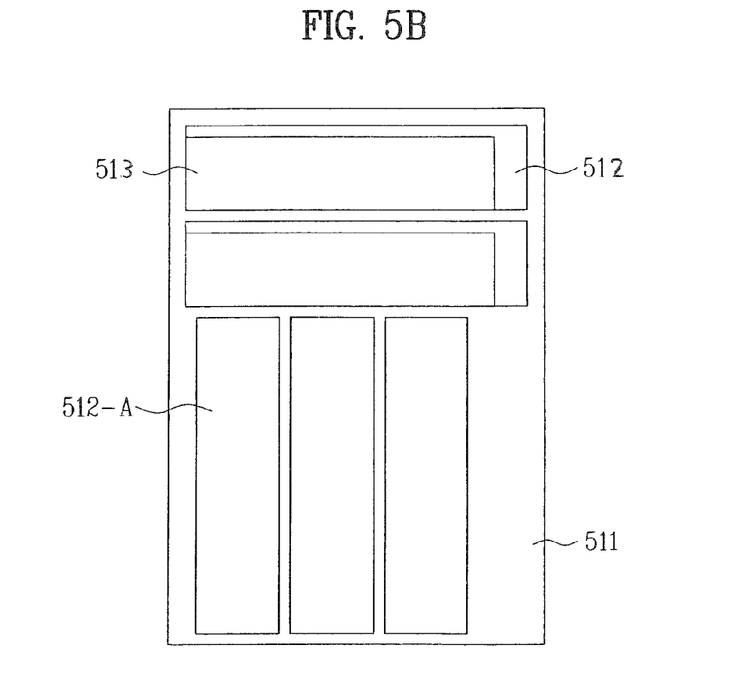

And then, as illustrated in FIG. 5B, a supplement electrode 513 is formed in a smaller width than that of the ITO strip 512 as such a conductive metal as Mo and Cr.

Figure 5C:
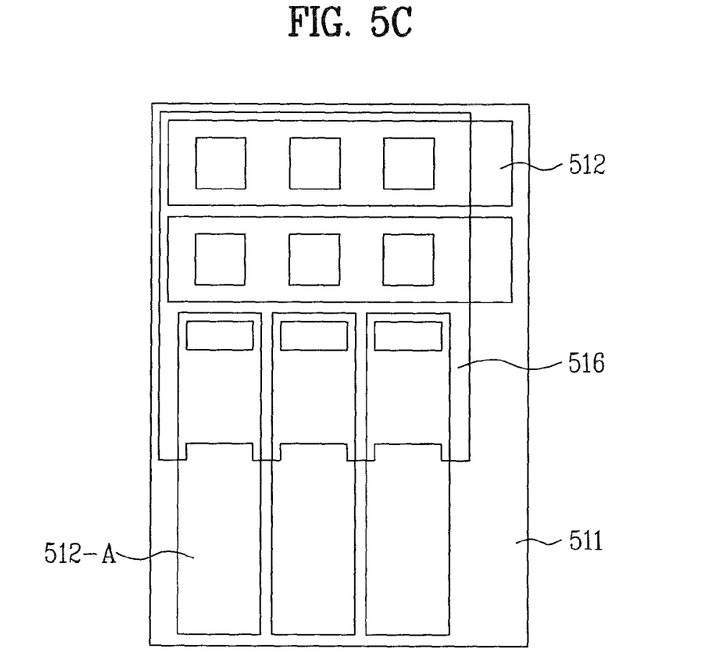

As illustrated in FIG. 5c, an insulating film 516 is further formed. In this case, the insulating film 516 is provided from a predetermined area including a location where a sealant and the supplement electrode 513 are crossed to a portion of the glass substrate 511 around an organic EL display to be described later.

Figure 5D:
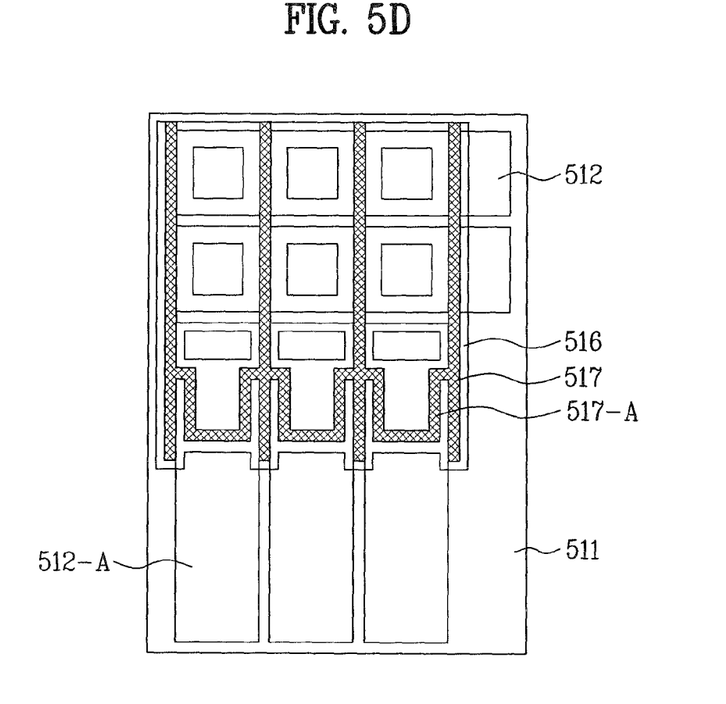

As illustrated in FIG. 5D, a bulkhead 517 electrically insulating is provided for insulating between the anode strips to be described later. In this case, a supplement bulkhead 517-A is further provided for preventing a sealant 518 from being injected along the bulkhead into an emitting cell.

Figure 6:
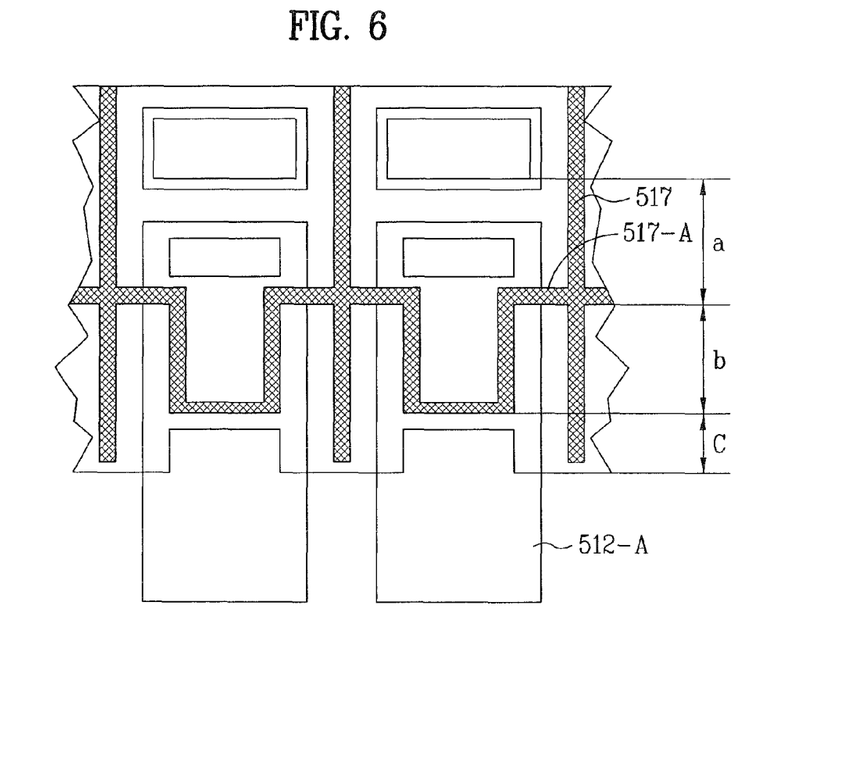
FIG. 6 illustrates a structure of a supplement bulkhead in accordance with the present invention.

In other words, as illustrated in FIG. 6A, the supplement bulkhead 517-A is provided at a distance of a from the emitting cell, in a length of b, and inside at a distance of c from an end of the bulkhead 517. In this case, each of the a, b, c is set larger than 0.

Figure 7A:
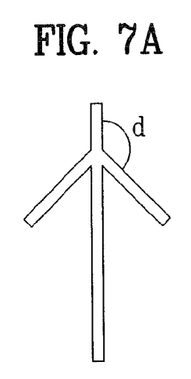
FIG. 7A to FIG. 7F illustrate various forms of supplement bulkheads in accordance with the present invention.
Figure 7B:
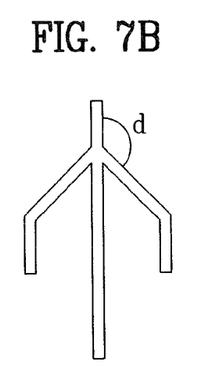
Figure 7C:
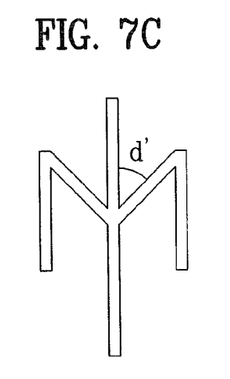

Meanwhile, the supplement bulkhead 517-A is formed in various types of forms. In other words, as illustrated in FIG. 7A to FIG. 7C, the supplement bulkhead 517-A is provided at a predetermined angle (larger than 0 and less than 180), not at a right angle. In this case, the symbol d and d' are an angle between the bulkhead 517 and the supplement bulkhead 517-A.

Figure 7D:
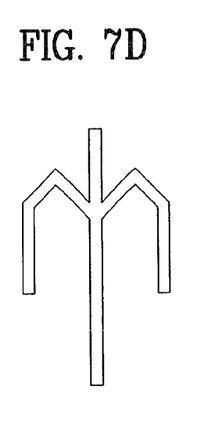
Figure 7E:
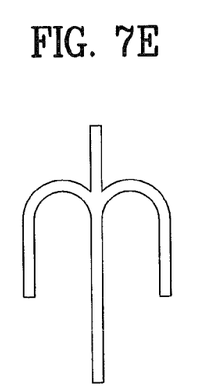
Figure 7F:
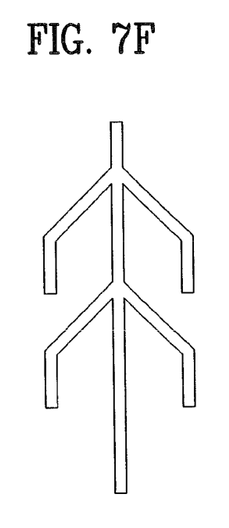

As illustrate in FIG. 7D to FIG. 7E, the supplement bulkhead 517-A may be formed in many polygonal, circular, and oval forms. Similarly, as illustrated in FIG. 7F, the sealant is prevented by the bulkhead 517 including more than two supplement bulkheads 517-A.

Figure 5E:
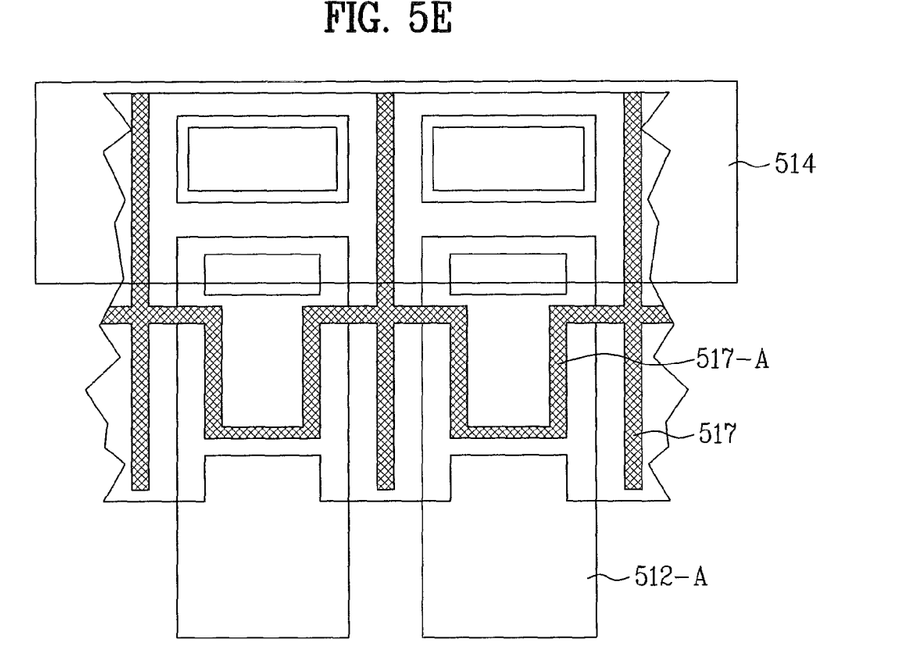

And then, as illustrated in FIG. 5E, the organic EL layer 514 including the hole transport layer, the emitting layer, and the electric transport layer is formed, and then the anode strip 515 including Mg—Ag compound metal, Aluminum or other conductive material is formed.

Figure 5F:
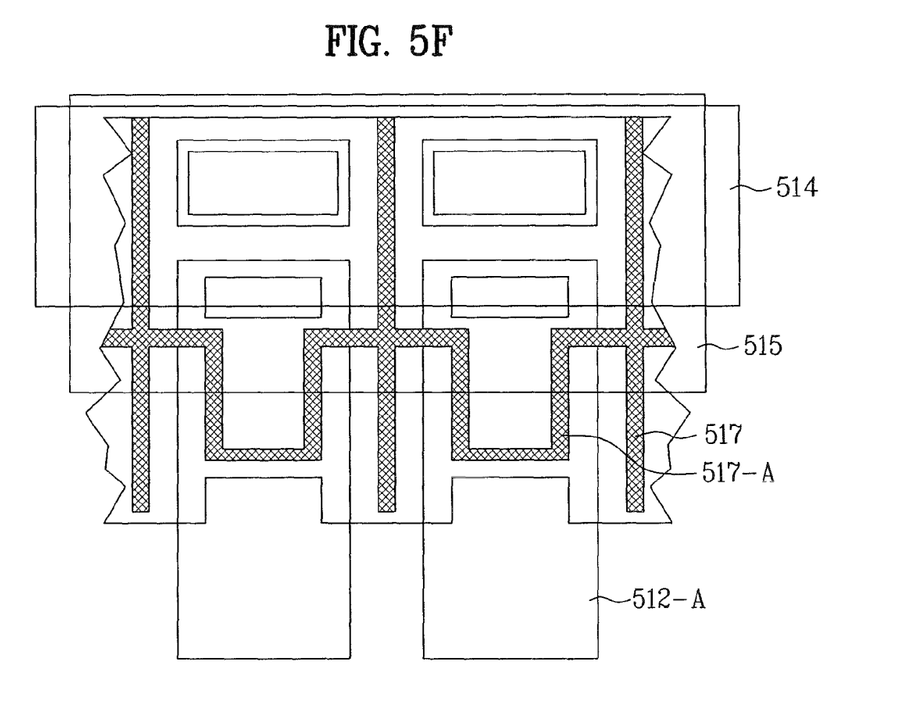
Figure 5G:
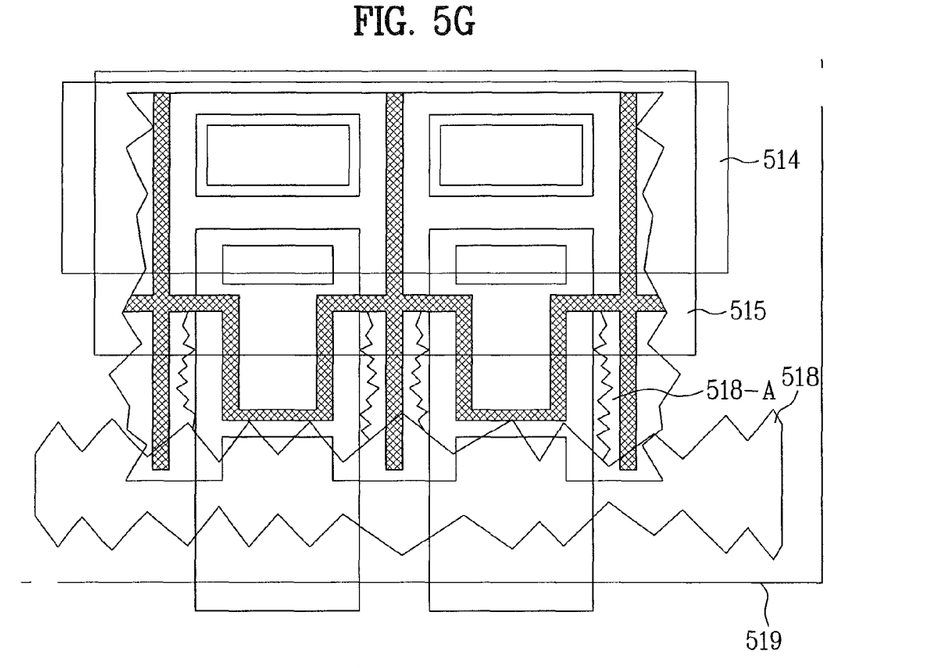

Finally, as illustrated in FIG. 5F, the seal-cover 519 is adhered by using the sealant 518 so as to complete the organic El display panel. As illustrated in the drawing, the sealant 518 being injected along the bulkhead is stopped by the supplement bulkhead 517-A.

As described above, the organic EL display panel prevents the sealant 518 from being injected along the bulkhead 517 into the emitting cell by forming the supplement bulkhead 517-A coupling the bulkheads 517 at the end of the bulkhead thereby the inferior device is reduced and the yield is improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic EL display device, comprising:
a substrate having a display area and a non-display area;
an insulating layer provided over the substrate;

an array of light emitting elements formed over the display area of the substrate, each light emitting element comprises an anode, a cathode and an electroluminescent layer provided between the anode and the cathode;

a cover to cover the array of light emitting elements;

a sealant provided in the non-display area between the cover and the substrate and provided near the periphery of the cover;

a sealant barrier formed on the insulating layer and around the array of the light emitting elements, wherein the sealant barrier is formed in the non-display area between the array and the sealant and wherein the sealant barrier includes a structure comprising:

a first portion arranged in a first direction, a second portion that extends from the first portion and is arranged in a second direction which crosses the first direction, and a third portion that extends from the second portion and is arranged substantially in the first direction or another direction, wherein the first portion is a first distance from the array of light emitting elements and the second portion is a second distance from the array of light emitting elements and wherein the second distance is greater than the first distance.

2. The organic EL display device of claim 1, wherein a height of the sealant barrier is lower than a height of the sealant.

3. The organic EL display device of claim 1, wherein the anode is formed of indium tin oxide (ITO).

4. The organic EL display device of claim 1, wherein a supplemental electrode is formed on an upper surface of the anode.

5. The organic EL display device of claim 4, wherein the supplemental electrode completely overlaps the upper surface of the anode.

6. The organic EL display device of claim 5, wherein the supplemental electrode has a smaller dimension than the anode.

7. The organic EL display device of claim 5, wherein the cathode is made of Mg—Ag compound.

8. The organic EL display device of claim 1, further comprising a plurality of row barriers, each row barrier provided between a different pair of adjacent rows of the light emitting elements.

9. The organic EL display device of claim 1, wherein:
the sealant barrier includes a plurality of sections provided between the plurality of row barriers respectively,
each of the sections has said structure and
the first, second, and third portions in a first section are separated a predetermined distance from the first, second, and third portions in a second section.

10. The organic EL display device of claim 9, wherein each row barrier extends beyond one or more of the sealant barrier sections in a direction toward the non-display area.

11. The organic EL display device of claim 9, wherein each sealant barrier section has substantially a same shape.

12. The organic EL display device of claim 9, wherein the sealant barrier sections are integrally formed with the plurality of row barriers.

13. The organic EL display device of claim 9, wherein the sealant barrier sections have projecting portions which extend in a direction towards the non-display area, the projecting portions including at least one of the first, second, or third portions.

14. The organic EL display device of claim 9, wherein the plurality of row barriers passes through respective ones of the sealant barrier sections.

15. The organic EL display device, wherein each of the sealant barrier sections is oriented at substantially a same predetermined angle relative to corresponding ones of the plurality of row barriers.

16. An organic EL display, comprising:
a substrate having a display area and a non-display area;
an insulating layer provided over the substrate;
an array of light emitting elements formed in the display area of the substrate, each light emitting element comprising an anode, a cathode, and an electroluminescent layer between the anode and the cathode;
a cover to cover the array of light emitting elements;
a sealant provided in the non-display area between the cover and the substrate and provided adjacent a periphery of the cover;
a sealant barrier formed on the insulating layer and around the array of the light emitting elements, the sealant barrier formed in the non-display area between the array and the sealant, wherein the sealant barrier has a structure which includes:
a first portion arranged in a first direction,
a second portion that extends from the first portion and is arranged in a second direction crossing the first direction, and
a third portion that extends from the second portion and is arranged in substantially the first direction or another direction, wherein the first portion is separated from the array of light emitting elements by a first distance and the second portion is separate from the array of light emitting elements by a second distance greater than the first distance, and wherein the second portion and third portion are formed over the anode.

17. The organic EL display of claim 16, further comprising:
a plurality of row barriers,
wherein each row barrier is provided between a different pair of adjacent rows of the light emitting elements and wherein each row barrier contacts the sealant barrier.

18. The organic EL display of claim 17, wherein:
the sealant barrier includes a plurality of sections provided between the plurality of row barriers respectively,
each of the sections has said structure, and
the first, second, and third portions in a first section are separated a predetermined distance from the first, second, and third portions in a second section.

19. The organic EL display of claim 18, wherein each row barrier extends beyond one or more of the sealant barrier sections in a direction toward the non-display area.

20. The organic EL display of claim 18, wherein each sealant barrier section has substantially a same shape.

21. The organic EL display device of claim 1, wherein the second direction is substantially perpendicular to the first direction.

22. The organic EL display device of claim 21, wherein the third portion is arranged in substantially the first direction.

23. The organic EL display device of claim 16, wherein the second direction is substantially perpendicular to the first direction.

24. The organic EL display device of claim 23, wherein the third portion is arranged in substantially the first direction.

* * * * *